United States Patent

Wen et al.

[11] Patent Number: 5,773,897
[45] Date of Patent: Jun. 30, 1998

[54] FLIP CHIP MONOLITHIC MICROWAVE INTEGRATED CIRCUIT WITH MUSHROOM-SHAPED, SOLDER-CAPPED, PLATED METAL BUMPS

[75] Inventors: Cheng P. Wen, Mission Viejo; Wah S. Wong, Montebello, both of Calif.

[73] Assignee: Raytheon Company, Lexington, Mass.

[21] Appl. No.: 803,656

[22] Filed: Feb. 21, 1997

[51] Int. Cl.⁶ .............................. H05K 1/09; H01L 29/46
[52] U.S. Cl. ...................... 257/778; 257/777; 257/735; 257/737; 257/724; 257/728
[58] Field of Search ..................... 257/778, 737, 257/734, 735, 738, 724, 723, 728, 777; 174/257; 438/125, 574, 613; 228/254

[56] References Cited

U.S. PATENT DOCUMENTS

| | | | |
|---|---|---|---|
| 4,021,838 | 5/1977 | Warwick | 257/777 |
| 4,661,834 | 4/1987 | Varteresian et al. | 257/724 |
| 5,108,027 | 4/1992 | Warner et al. | 228/254 |
| 5,406,122 | 4/1995 | Wong et al. | 257/753 |
| 5,508,561 | 4/1996 | Tago et al. | 257/737 |
| 5,510,758 | 4/1996 | Fujita et al. | 257/728 |
| 5,514,838 | 5/1996 | Wen et al. | 174/257 |
| 5,569,960 | 10/1996 | Kumazawa et al. | 257/778 |
| 5,616,512 | 4/1997 | Wen et al. | 438/574 |
| 5,629,241 | 5/1997 | Matloubian et al. | 438/125 |

FOREIGN PATENT DOCUMENTS 3-174731  7/1991  Japan ..................................... 257/737

*Primary Examiner*—Tom Thomas
*Assistant Examiner*—Alexander Oscar Williams
*Attorney, Agent, or Firm*—Leonard A. Alkov; Glenn H. Lenzen, Jr.

[57] ABSTRACT

Mushroom-shaped, solder-capped, small-diameter (approximately 50 to 75 microns or less), metal bumps are used in the flip chip monolithic microwave integrated circuits (MMICs) attachment process to provide devices having improved solder volume uniformity. The operation of the MMIC device is extended to millimeter-wave frequencies. The self-alignment property of the solder reflow flip chip attachment process is retained, and enhanced by the solder cap that extends beyond the periphery of the metal bump. Solder flux instead of solder paste patterns are printed on the assembly substrate to facilitate flip chip attachment. The metal bumps comprise electroplated silver pillars having a first diameter capped with electroplated solder having a second diameter, where the second diameter is larger than the first diameter, and are formed using a multi-layer negative photoresist, multiple exposure processing sequence.

3 Claims, 2 Drawing Sheets

FLIP CHIP MONOLITHIC MICROWAVE INTEGRATED CIRCUIT WITH MUSHROOM-SHAPED, SOLDER-CAPPED, PLATED METAL BUMPS

BACKGROUND OF THE INVENTION

1. Field of the Invention

The present invention relates to the fabrication of GaAs monolithic microwave integrated circuits (MMICs), and, more particularly, to process enhancements that extend the operation of MMICs to millimeter (mm)-wave frequencies.

2. Description of Related Art

The flip chip configuration is highly desirable for the fabrication of MMIC microelectronic circuit structures, since it eliminates the need for wirebonds or other leads to interconnect a MMIC chip on a ceramic (for example, aluminum nitride (AlN)) substrate. A MMIC flip chip includes metallic (e.g., silver or gold) plated electrical contact bumps which extend from input-output (I/O) and electrical bias sites on the chip surface for mating with contacts on the ceramic substrate.

The chip is inverted and placed in contact with the ceramic substrate such that the bumps are aligned and pressed against solder paste formed on the contacts. Heat is applied to the contacts to cause the solder to reflow and fuse the bumps to the contacts to provide a permanent ohmic contact.

A description of the formation and passivation of MMICs is given in U.S. Pat. No. 5,406,122, entitled "Microelectronic Circuit Structure Including Conductor Bridges Encapsulated in Inorganic Dielectric Passivation Layer", issued Apr. 11, 1995.

Increasing precision chip placement and wire bonding requirements are imposed on radio frequency (RF) assemblies as the operating wavelength becomes shorter. Flip chip MMIC technology is ideal for multi-chip module fabrication because of its precision, self-alignment property; surface tension of the melted solder during the reflow attachment process serves to align the chips in proper position. Adaptation of flip chip monolithic integrated circuit based, hybrid assembly techniques is therefore the ideal solution to high unit cost of mm-wave systems.

Flip chip MMIC size and unit cost are limited by current bump design rules (the minimum dimension is 150 microns, and the minimum spacing between adjacent bumps is 450 microns center to center). These design rules are dictated by the flip chip attachment process using screen-on solder paste pattern on substrate and the photolithographic techniques in plated silver bump fabrication.

The solder paste currently used for flip chip MMIC attachment is a mixture of solder flux and tiny (25 micron diameter) solder spheres. The finite size of the solder balls poses a limit on the resolution of the patterns screen-printed on the assembly substrate, and consequently, on the chip alignment accuracy.

Because of the gold-based circuitry on microwave hybrid assemblies, a 50/50 lead (Pb)-indium (In) solder paste, which is a mixture of solder flux and 25-micron diameter solder spheres, is used for flip chip MMIC attachment. The volume of solder under a given bump is simply determined by the thickness of the solder paste and the density (actual number of solder spheres per unit volume) of solder in the paste under that particular bump. The standard deviation of solder volume under a bump will increase as the bump diameter to solder sphere ratio decreases. For instance, there are a maximum of 28 solder spheres under a bump of 150 micron diameter, and only 7 under a 75-micron diameter bump. The variation of solder density in the paste leads to solder volume non-uniformity under the bumps, and this variability in solder volume per unit bump area leads to non-uniformity in electrical, thermal and mechanical properties at the MMIC chip/assembly substrate interface. Therefore, current flip chip technology using solder paste poses a severe limit on minimum bump size, and chip compaction. The variability in solder volume per unit bump area leads to non-uniformity in thermal, mechanical and electrical characteristics of an MMIC assembly. These solder paste related problems escalate with reduced bump size, especially as the bump diameter approaches that of the solder sphere cross section.

Ultimate alignment accuracy of the flip chip attachment process depends on the placement accuracy and the resolution of the solder paste pattern on an assembly substrate. The 25-micron solder ball size has led to the design rule of the substrate where the solder paste pattern must enclose the bumps by 75 microns on each side, and the smallest separation between adjacent patterns is 150 microns.

The self-alignment property of solder reflow flip chip attachment process depends on the surface tension of the melted solder at the side wall of the bumps. Thick (75 microns) sheet negative photoresist is currently used to provide the proper profile of the 75-micron tall, 150-micron diameter plated silver bumps for current flip chip MMICs. The minimum opening that can be repeatedly achieved with the current process is 125 microns, representing a 0.6 photoresist thickness to bump diameter ratio.

Thus, there is a need for improved solder volume uniformity from bump to bump.

SUMMARY OF THE INVENTION

In accordance with the present invention, mushroom-shaped, solder-capped, small-diameter (approximately 75 microns or less), metal bumps are used in the flip chip monolithic microwave integrated circuits (MMICs) attachment process to provide devices having improved solder volume uniformity. The operation of the MMIC devices is extended to millimeter-wave frequencies. The self-alignment property of the solder reflow flip chip attachment process is retained, and enhanced by the solder cap that extends beyond the periphery of the metal bump. Solder flux instead of solder paste (a mixture of solder flux and solder particles) patterns are printed on the assembly substrate to facilitate flip chip attachment.

The metal bumps of the present invention comprise electroplated silver pillars having a first diameter, which are capped with electroplated solder having a second diameter, where the second diameter is larger than the first diameter, thereby forming mushroom-shaped, solder-capped, plated metal bumps.

The method of the present invention of securing the substrate supporting at least one flip chip monolithic microwave integrated circuit (the module substrate) to the assembly substrate by soldering a plurality of solder bumps on the flip chip to the assembly substrate comprises:

(a) forming a plurality of electroplated silver solder bumps on the module substrate, the silver solder bumps having a first diameter;

(b) forming an electroplated solder cap on each solder bump, each solder cap having a second diameter, wherein the second diameter is larger than the first diameter;

(c) forming a plurality of solder flux patterns on the assembly substrate in locations matching locations of the silver solder bumps;

(d) inverting one substrate relative to the other and matching a silver solder bump to a solder flux pattern to form an assembly;

(e) heating the assembly to a temperature sufficient to cause the solder to flow; and (f) cooling the assembly to room temperature.

The present invention provides improved solder volume uniformity from bump to bump, leading to a more repeatable solder reflow chip attachment process. It also serves to improve chip alignment accuracy, which is critical to mm-wave integrated circuit assemblies.

DESCRIPTION OF THE PREFERRED EMBODIMENTS

Figure 1:
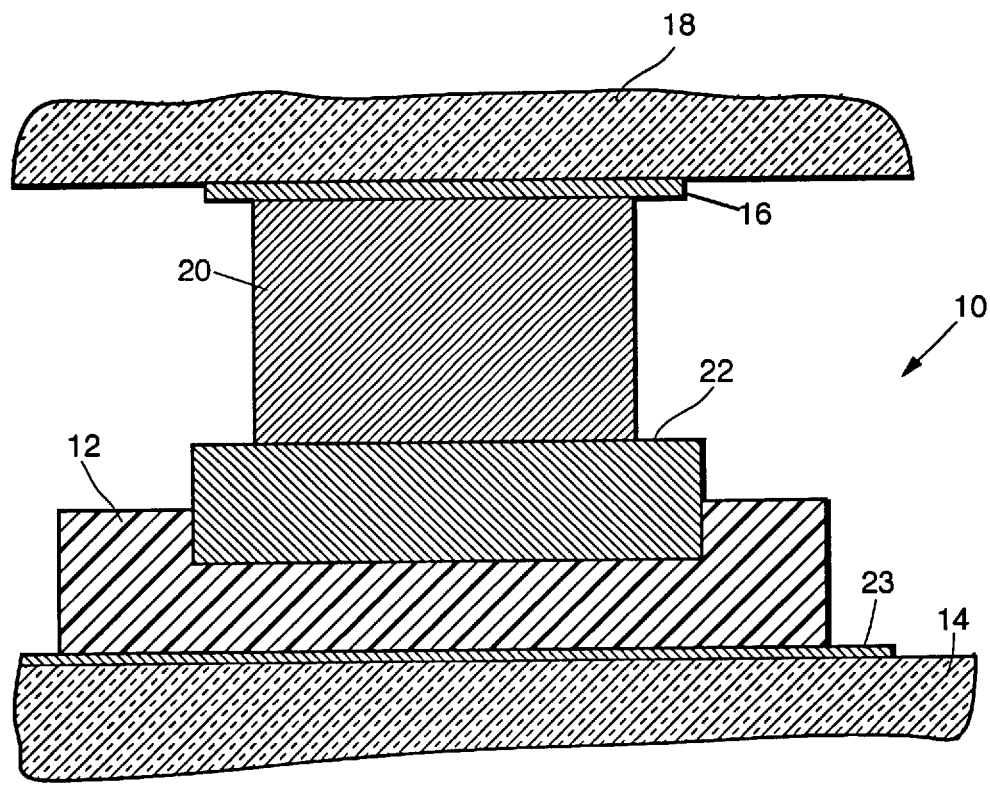
FIG. 1 is a cross-sectional view of a mushroom-shaped, solder-capped, silver bump in a high resolution solder flux pattern, depicting an embodiment of the present invention.

In accordance with the present invention, the high-power, flip chip attachment technology can be extended to millimeter-wave (30 to >100 GHz) frequencies by using mushroom-shaped, solder-capped, plated silver bumps on the MMICs. The cross-section of such a bump is shown in FIG. 1, which depicts an up-side-down, mushroom-shaped, solder-capped, plated silver bump 10 immersed in a solder flux pattern 12 on a ceramic substrate 14. In particular, a metal bump pad 16 is formed on a MMIC substrate 18 in contact with active device elements (not shown) previously formed therein. Such devices formed in the MMIC substrate 18 are conventional.

The metal bump pad 16 comprises a conventional titanium/gold/titanium membrane, as disclosed in the above-mentioned U.S. Pat. No. 5,406,122. The formation of the Ti/Au/Ti membrane may be accomplished by sputtering. Other suitable electrically conducting metal films may alternatively be used.

A silver bump 20 is electroplated on the metal bump pad 16 by methods well-known in this art. A precision mushroom-shaped, solder cap 22 is electroplated on the surface of the plated silver bump 20 opposite the metal bump pad 16; the solder cap 22 and the silver bump 20 together form the mushroom-shaped, solder-capped, plated silver bump 10. The solder cap 22 may comprise any appropriate solder alloy that is compatible with the MMIC process; examples include tin-lead solders of different compositions.

Plated silver thermal bumps directly on top of the MMIC transistors also serve as low-resistance thermal paths, conducting heat directly from the active devices to a large footprint on the millimeter-wave module substrate. Silver is chosen over other potential flip chip bump materials and processes because reflow solder (flex bumps) bumps commonly used for flip chip digital circuits are incompatible with high power density monolithic mm-wave integrated circuit applications because of thermal management considerations. A plated silver bump whose thermal conductivity (4.18 W/cm-°K) is nearly twenty times that of 50/50 PbIn solder (0.22 W/cm-°K) is selected as the baseline process of the present invention.

The assembly substrate 14 is a ceramic substrate, commonly, an aluminum nitride (AlN) substrate, on which is formed a metal interconnect pattern 23. The ceramic substrate may alternatively comprise any of the electrically insulating materials commonly employed in this art, such as alumina, beryllia, or low temperature co-fired ceramic (LTCC). The metal interconnect pattern 23 comprises, for example, thick film silver- or gold-based circuitry or thin film titanium, gold, or copper circuitry.

Dots of solder flux 12 are deposited on the metal interconnect pattern 23 at mating contact sites. The solder flux 12 comprises any of the solder fluxes commonly employed with the solder composition of the solder cap 22 or a citric acid-based "no-clean" flux.

The MMIC substrate 18 is then inverted and pressed against the ceramic substrate 14 such that each of the solder-plated silver bumps 10 contacts one of the flux dots 12. Heat is applied to cause the solder to reflow and adhere the bump 10 to the metal interconnect pattern 23. Following cooling to room temperature, the soldered assembly is ready for further processing and packaging.

As an example, the diameter of the 50-micron tall, plated silver bump 20 is 75 microns; a 25-micron thick, concentric solder cap 22 is plated on top of the silver bump using a multi-layer negative photoresist, multiple exposure processing sequence illustrated in FIGS. 2A–2D.

Figure 2A:
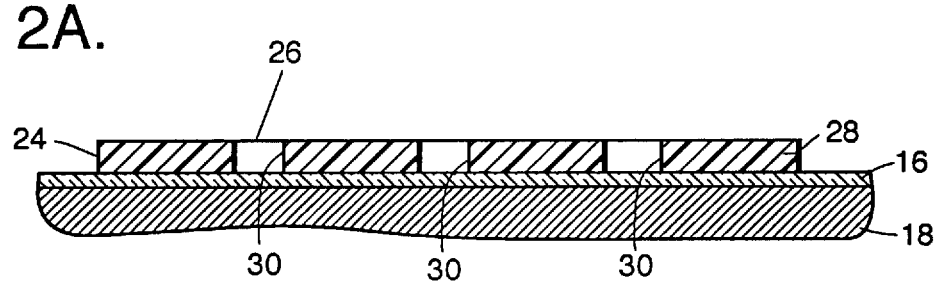
FIGS. 2A–2D are cross-sectional views, depicting the fabrication sequence of a plurality of the bumps depicted in FIG. 1.

FIG. 2A depicts a first photoresist layer 24, comprising unexposed portions 26 and exposed portions 28, formed on the metal bump pad 16. The unexposed portions 26 are removed by developing the resist in a suitable developer, leaving first openings 30. The first resist and developer employed are conventional. The first resist is patterned, as is conventional. As an example, the diameter of the first openings 30 is 75 microns.

Figure 2B:
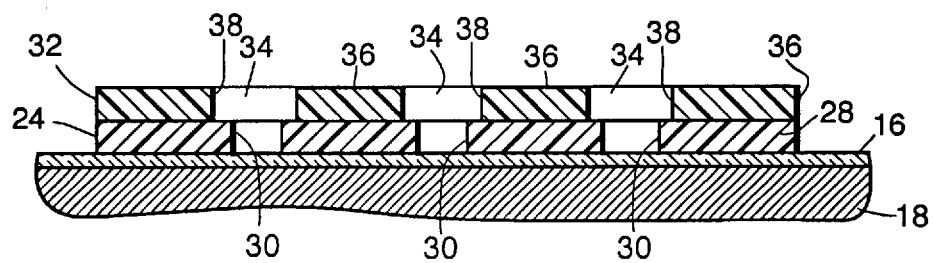

FIG. 2B depicts a second photoresist layer 32, also comprising unexposed portions 34 and exposed portions 36, formed on the first photoresist layer 24. Again, the unexposed portions 34 are removed in a suitable developer, leaving second openings 38. As with the first photoresist layer, the second resist and developer employed are conventional, and the second resist is patterned, as is conventional. The second openings 38 are larger in diameter than the first openings 30, giving rise to a "T"-shaped, or mushroom-shaped, profile.

Figure 2C:
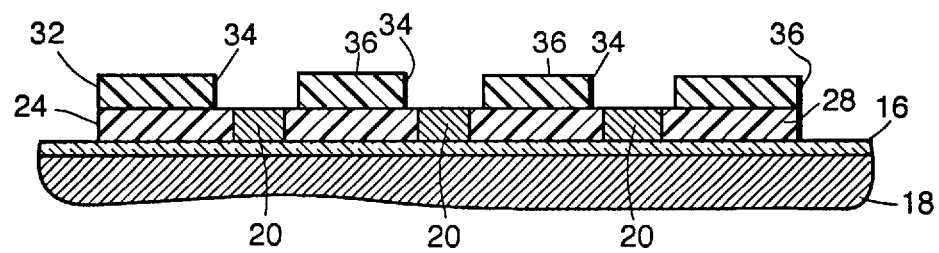

FIG. 2C depicts the structure of FIG. 2B following plating of a layer of silver on the metal bump pad 16 to form the plated silver bumps 20. The electroplating of the silver bumps 20, using the metal bump pad 16 as an electrode, employs conventional electroplating techniques to form the silver layer to a thickness of about 25 to 90 microns, and, preferably, to a thickness of about 50 microns.

Figure 2D:
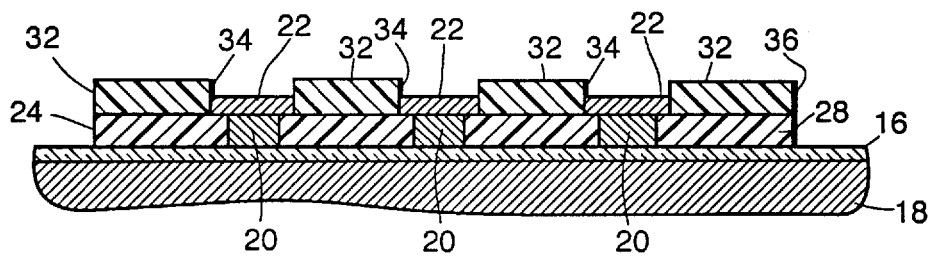

FIG. 2D depicts the structure of FIG. 2C following plating of a layer of solder on the plated silver bumps 20 to form mushroom-shaped plated solder caps 22. The electroplating of the solder caps 22, using the metal bump pad 16 and plated silver bumps 20 as an electrode, employs conventional electroplating techniques to form the solder layer to a thickness of about 12 to 30 microns, and, preferably, to a thickness of about 25 microns.

The exposed photoresist portions 28 and 36 are subsequently removed, using a conventional photoresist removal process.

The diameter of the plated solder cap 22 exceeds that of the silver bump 20 by design. Preferably, the diameter of the solder cap 22 is about 25 to 50 microns greater than the diameter of the silver bump 20. The excess solder evenly distributed beyond the periphery of the bump 20 wets its side wall during the solder reflow chip attachment process, providing self-alignment property of the flip chip process.

The 75-micron diameter, reduced size bumps for mm-wave MMIC is realizable by using two layers of 45-micron thick sheet negative photoresist. The photoresist thickness to bump diameter ratio of 0.6 is maintained.

Figure 3:
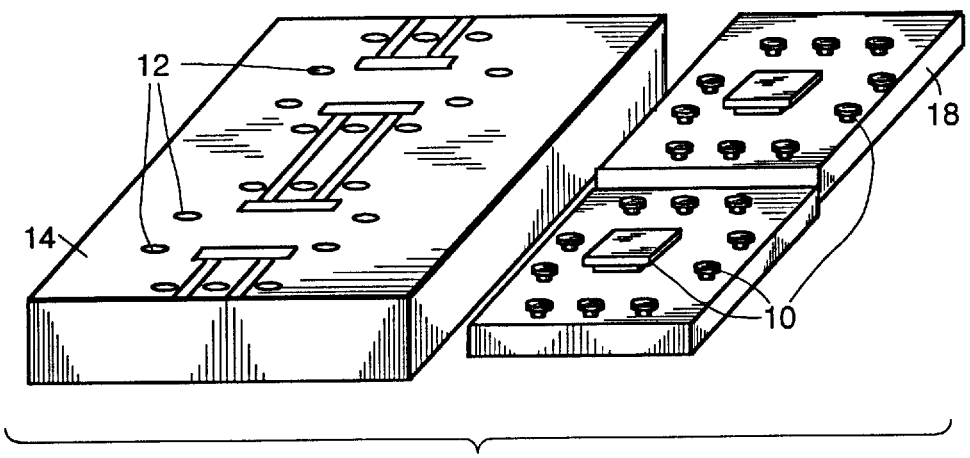
FIG. 3 is a perspective view of a flip chip millimeter-wave integrated circuit assembly using the solder-capped silver bumps of the present invention, prior to joining together of the two substrates.

The solder paste patterns of the prior art on the assembly substrate 14 are replaced by solder flux patterns 12, shown in FIG. 3, when the solder-capped bumps 10 are incorporated into the MMICs. As indicated above, the solder flux 12 may comprise any of the conventional solder fluxes commonly employed with the solder bumps 22.

FIG. 3 depicts the ceramic assembly substrate 14 with the solder flux pattern 12 thereon and the MMIC substrate 18 with the mushroom-shaped, solder-capped, silver bumps 10 thereon prior to assembly. FIG. 1 depicts the completed assembly of the two component parts formed by heating to a sufficient temperature to melt the solder and adhere the plated silver bump 20 to the metal-coated ceramic assembly substrate 14.

Uncertainty associated with the fluctuations of solder density in a solder paste is eliminated by the approach taken by the present invention. The quantity of solder under a bump, and that surrounding a bump, are precisely controlled by a combined photolithographic-plating process. In addition, the achievable resolution of the solder flux patterns is superior to that of the solder paste patterns, whose edge resolution is limited by the finite size of the solder spheres (25 microns).

Thus, there has been disclosed a mushroom-shaped, solder-capped, silver bump configuration on a flip chip MMIC in conjunction with high resolution solder flux patterns on an assembly substrate and a method for forming the same. It will be readily appreciated by those skilled in this art that various changes and modifications of an obvious nature may be made, and all such changes and modifications are considered to fall within the scope of the present invention, as described by the appended claims.

What is claimed is:

1. A flip chip structure comprising a monolithic microwave integrated circuit formed on a module substrate and mounted on an assembly substrate, said module substrate further including a plurality of solder bumps for securement of said module substrate to said assembly substrate, said solder bumps comprising electroplated silver pillars having a first diameter and being capped with electroplated solder having a second diameter, where said second diameter is larger than said first diameter.

2. The flip chip structure of claim 1 wherein said second diameter is approximately 25 to 50 microns greater than said first diameter.

3. The flip chip structure of claim 1 wherein said electroplated solder has a composition selected from the group consisting of tin-lead solders of different compositions.

* * * * *